United States Patent [19]

Kata et al.

[11] Patent Number: 5,292,574
[45] Date of Patent: Mar. 8, 1994

[54] CERAMIC SUBSTRATE HAVING WIRING OF SILVER SERIES

[75] Inventors: Keiichiro Kata; Yuzo Shimada, both of Tokyo, Japan

[73] Assignee: NEC Corporation, Japan

[21] Appl. No.: 740,634

[22] Filed: Aug. 5, 1991

[30] Foreign Application Priority Data

Aug. 8, 1990 [JP] Japan ................... 2-209484

[51] Int. Cl.⁵ .............................................. B32B 9/00
[52] U.S. Cl. .................... 428/209; 428/688; 428/426; 428/433; 428/901; 428/137; 361/792
[58] Field of Search ............... 428/209, 688, 426, 433, 428/901, 137; 361/414

[56] References Cited

U.S. PATENT DOCUMENTS 5,024,883 6/1991 SinghDeo .......................... 428/323

*Primary Examiner*—Patrick J. Ryan
*Assistant Examiner*—Cathy Lee
*Attorney, Agent, or Firm*—Laff, Whitesel, Conte & Saret

[57] ABSTRACT

A ceramic substrate comprises a ceramic body and a wiring pattern made of silver series selectively formed on the major face of the ceramic body. The ceramic body contains silver particles of 0.1 to 2.5 percents.

8 Claims, 1 Drawing Sheet

CERAMIC SUBSTRATE HAVING WIRING OF SILVER SERIES

BACKGROUND OF THE INVENTION

1. Field of the Invention

The present invention relates to a ceramic substrate, and more particularly, to a ceramic substrate for mounting thick-film hybrid ICs or high speed LSI elements.

2. Description of Related Art

According to the recent tendency of reducing size and weight of electronic devices such as communication equipment, home-use electric and electronic device, computer, etc., and of increasing number of functions, high-density and high-reliability of them, wiring technique for mutually connecting semiconductor chips has become more important in addition to high integration and high speed operation of these chips. As a substrate material, it can be roughly classified to an organic resin group, metal group and ceramic group. Among them, the ceramic group is frequently used in fields in which high quality, high reliability and long duration are required. Among ceramic materials, alumina has been widely used in views of its electric characteristics, its chemical stability, its mechanical characteristics and its cost. However, in order to use the green sheet multilayer method by which three dimensional wiring is possible and which is advantageous in realizing high density, conductor material of wiring layer is limited to metal such as tungsten or molybdenum whose specific resistance is relatively high since it must be heated to temperature as high as sintering temperature of alumina of 1500° to 1600° C.

In view of this, a low sintering temperature ceramic which is a composite material of glass and host ceramic has been developed. Since this composite material has a low melting point, metal material as wiring layer whose specific resistance is low and thus it can not be sintered simultaneously with sintering of ceramic material becomes usable. As such metal material as wiring layer, gold, silver and copper, etc., may be considered. However, gold and copper do not occupy large part of hybrid IC substrate market in views of high cost for gold and unstability against oxidation for copper and thus it can be said that silver or silver containing material is mainly used as wiring material. However, the wiring layer made of silver or of material containing silver has a migration problem, and to cope this problem a silver alloy with palladium or like has been used.

Although proportion of silver to palladium has been selected usually as 80:20 in views of anti-migration, solder-wettability, solder loss, adhesiveness and resistance value, it has been desired to use conductive material containing higher silver ratio in order to lower the resistance value and improve the solder wettability and aging characteristics. Solder loss, bad matching with cross over glass, degradation of solder wettability due to surface galvanization and silver migration can be avoided in various manners and thus it has high possibility of future development.

On the other hand, a multi-layered glass ceramic substrate in which wiring length can be reduced and high density wiring is possible is payed attention in multichip package which is used in a large, high speed computer and in which a large number of LSI chips are mounted on a single substrate. As wiring material in such multi-layered glass ceramic substrate, the above-mentioned silver or material containing silver is usually used. However, in order to further increase the mounting density, there is a tendency that the size of substrate becomes large. In order to sinter such large substrate in the same way as that of the conventional one, it is necessary to make the sintering time longer. However, this may enhance diffusion of silver of wiring into glass substrate during sintering process, resulting in a problem of remarkable degradation of various characteristics of the wiring of silver or material containing silver.

SUMMARY OF THE INVENTION

An object of the present invention is, therefore, to provide a substrate having a silver series wiring which hardly change its characteristics.

According to one feature of the present invention, there is provided a ceramic substrate which comprises a ceramic body having a major face. The ceramic body contains silver of 0.1 to 2.5 percents by weight. A wiring layer is formed on the major face of the ceramic body and is made of silver and material containing silver.

Another feature of the present invention provides a ceramic substrate which comprises a ceramic body which is constituted of a plurality of ceramic insulating layers stacked up to each other. Each of the ceramic insulating layers contains silver of 0.1 to 2.5 percents by weight and has upper and lower faces. A wiring pattern made of silver or material containing silver formed on the upper and/or lower faces of the ceramic insulating layers such that one group of wiring layers of the wiring pattern is positioned within the ceramic body. The ceramic body or ceramic insulating layer essentially consists of a main material and the silver, and the main material may essentially consists of ceramic such as alumina (aluminium oxide, $Al_2O_3$) and glass such as borosilicate series lead glass, or of quartz glass and cordierite and borosilicate glass. The silver is contained in the ceramic body in a state of particles, each having favorably 1 to 5 $\mu$m diameter, and the silver disperses substantially, uniformly in the main material such that at every portion of the ceramic body or ceramic insulating layer, the silver weight percentage to the total weight of the main material and the silver is 0.1% or more and 2.5% or less.

Since the ceramic substrate according to the present invention contains ceramic containing silver in 0.1–2.5% by weight, diffusion of the conductive material containing silver as main constituent and forming wiring to a ceramic insulating layer of the substrate during sintering process is restricted, resulting in stable wiring conductor characteristics after sintering.

DESCRIPTION OF THE PREFERRED EMBODIMENTS

Figure 1:
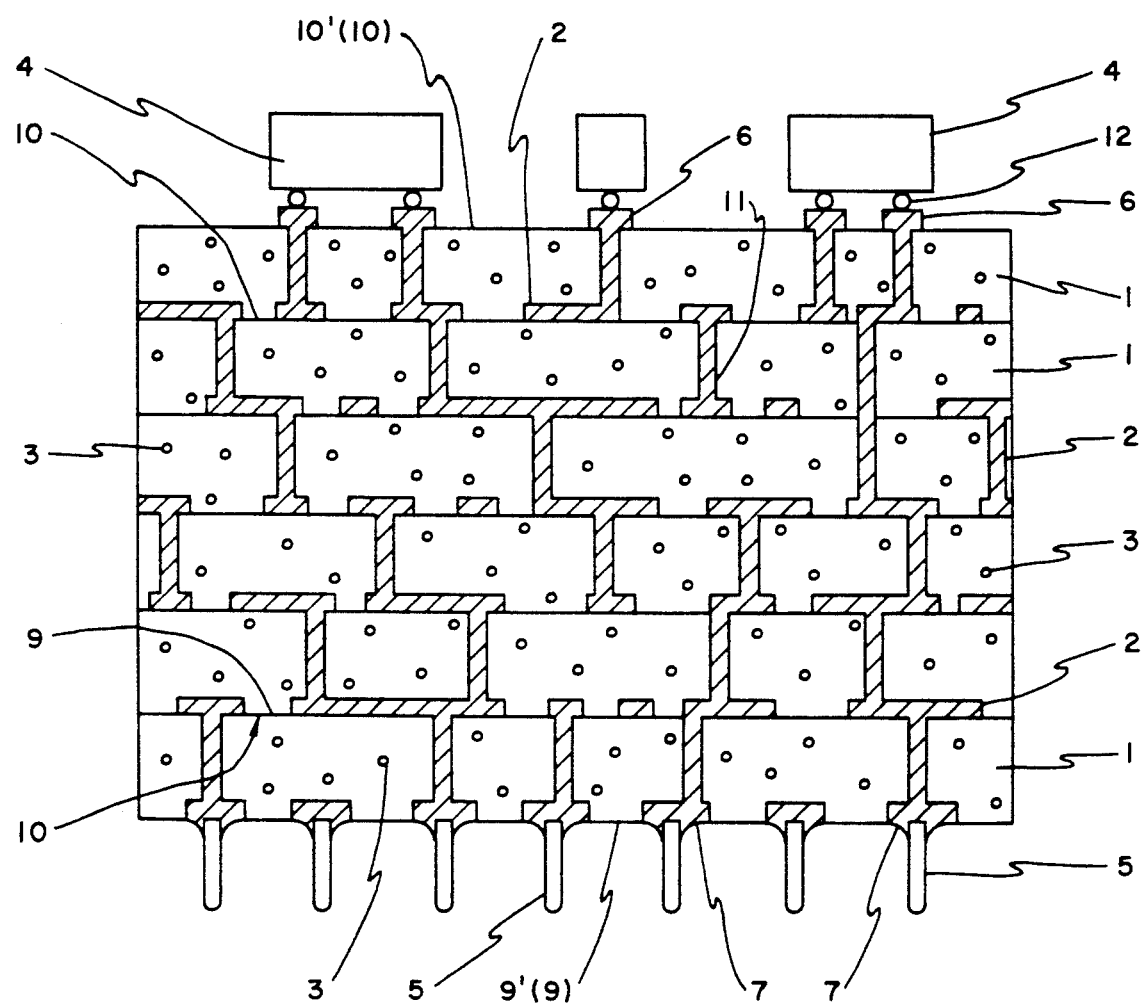
FIG. 1 is a cross-sectional view showing an embodiment of the present invention.

The present invention will be described in detail with respect to the drawing.

Embodiment 1

FIG. 1 is a cross-sectional view of a ceramic substrate according to the present invention. The ceramic substrate comprises a ceramic body including six of ceramic insulating layers 1 stacked up to each other, and a wiring pattern 2. The wiring pattern 2 is selectively formed on upper faces 10 and on lower faces 9 of respective ceramic insulating layers 1 and fill through holes 11 formed in the layers 1 to connect electrically respective upper and lower side wiring layers of the wiring pattern 2. The wiring pattern 2 of the 3-dimensional shape further includes first electrode wirings 6 on the upper face 10' of the most upper ceramic insulating layer 1 to bond a semiconductor element 4 such as IC, LSI chip by solder 12, and second wiring electrodes 7 on the lower face 9' of the most lower ceramic insulating layer 1 to bond terminal leads 5 including input and output terminal leads. The ceramic insulating layer 1 contains fine silver particles 3 represented by black circle in 0.1-2.5% by weight.

As Embodiment 1 of the present invention, a ceramic substrate to be prepared using binary powder material of alumina and lead borosilicate glass as raw material will be described. Since sintering temperature of this composite material is as low as 900° C., silver containing paste can be used as conductive material of wiring to be sintered simultaneously. As an example, an alloy of silver and palladium was used. Further, according to the main material of ceramic and glass, there are such merits as that its dielectricity is lower than that of alumina, that its thermal expansion coefficient is substantially matched with that of Si element and that its mechanical strength is improved by anorthite phase deposition due to reaction between alumina and glass and restricts migration of silver, etc.

In a case where the green sheet lamination which is advantageous in high density mounting is used as the manufacturing method of this substrate, raw glass powder is crushed to control particle size and then mixed with alumina in proportion of 45% of glass to 55% of alumina both by weight. Further, after adding a predetermined amount of fine silver particle having average size of 1-5 μm to the mixture and mixing it therewith, it is mulled with organic vehicle to obtain a slurry mixture. Then, a green sheet having a desired thickness is produced by using the slip casting film forming method and a shaped product is prepared through formation of through-holes, silver-palladium conductor pattern as a wiring pattern printing or through-hole filling printing, lamination and thermal pressing. The shaped product is sintered after removal of binder, resulting in a multi-layered wiring substrate.

Now, the reason for why the ratio of fine silver particle 3 to be added is limited to the range 0.1-2.5 wt % will be described. First, the amount of such silver particle has to be enough to prevent silver from diffusing into the glass phase forming the insulating layer during the sintering process. However, when the amount of the additive is too large, the characteristics of the insulating layer, particularly, insulating characteristics, is degraded rapidly. In the circumstances, effect of fine silver particle on characteristics of the silver containing conductor and the insulating layer have been studied while changing the adding ratio of fine silver particle from 0 to 10 wt %. Specific resistances of the conductors containing 100 wt % silver and 95 wt % silver calculated from resistance and cross sectional area after sintered were selected as the conductor characteristics and shrinkage, density of sintered body calculated on Archimedean principle, bending strength calculated according to three-point bending method, dielectricity and dielectric loss at 1 MHz, insulating resistance when a voltage of 50 V is applied, breakdown voltage and average thermal line expansion coefficient in a range from room temperature to 350° C. were selected as the insulating layer characteristics. Results are shown in Table 1. In the case where no fine silver particle is added to the insulating layer, the specific resistance of the conductor varies considerably and is unstable. It is observed that, when fine silver particle of 0.1 wt % is added to the insulating layer, diffusion of silver from the conductor during sintering process is restricted and specific resistance becomes stable. On the other hand, for the characteristics of the insulating layer, when the adding ratio of fine silver particle exceeds 2.5 wt %, degradation is observed. Particularly, the insulating characteristics such as insulating resistance and breakdown voltage are degraded abruptly. Therefore, the ratio of fine silver particle as additive with which characteristics of the silver containing conductor forming the wiring is stabilized without affecting the characteristics of the insulating layer adversely can be defined to a range from 0.1 to 2.5 wt %.

TABLE 1

| adding rate of fine silver particle (wt %) specific resistance of conductor (wiring) ($\mu\Omega \cdot$ cm) | 0 | 0.1 | 1.0 | 2.5 | 5.0 | 10.0 |
|---|---|---|---|---|---|---|
| Ag: 100 | 2.1~3.5 | 2.1~2.3 | 2.1~2.3 | 2.1~2.3 | 2.1~2.3 | 2.1~2.3 |
| 95 | 5.2~10.7 | 5.2~5.8 | 5.2~5.8 | 5.2~5.8 | 5.2~5.8 | 5.2~5.8 |
| shrinking rate (%) | 13.7 | 14.3 | 14.3 | 14.2 | 14.1 | 14.0 |
| density of material to be sintered (g/cm$^3$) | 3.14 | 3.16 | 3.17 | 3.19 | 3.25 | 3.36 |
| bending strength (kg/cm$^2$) | 3000 | 3200 | 3100 | 3000 | 3100 | 3200 |
| dielectricity | 7.8 | 7.8 | 7.8 | 7.9 | 8.5 | 9.2 |
| dielectric loss | 0.002 | 0.002 | 0.002 | 0.01 | 0.05 | 0.10 |
| insulating resistance ($\Omega \cdot$ cm) | 710$^{13}$ | 710$^{13}$ | 710$^{13}$ | 710$^{12}$ | 710$^9$ | 710$^6$ |
| breakdown voltage (KV/cm) | 7150 | 7150 | 7150 | 7120 | 7100 | 750 |
| thermal expansion coefficient ($\times 10^{-7}$/°C.) | 48 | 48 | 48 | 54 | 63 | 71 |

Embodiment 2

As a second embodiment of the present invention, a case where ternary ceramic including quartz glass, cordierite and borosilicate glass is used as raw material for a ceramic substrate will be described. Since sintering temperature of this composite material is as low as 900° C., it is possible to use silver containing paste as a sintering conductor as wiring layer, simultaneously. As an example, an alloy of silver and palladium was used as in the embodiment 1. Further, this material has dielectricity of as low as 4.4 which is advantageous in speed-up of transmission and its thermal expansion coefficient is well matched with an Si element. Its anti-bending strength is relatively high and is 1600 kg/cm. A mixing ratio in weight is 20:15:65. Effects of this material on the characteristics of the conductor and the insulating layer were checked with adding ratio of fine silver particle being changed from 0 to 10 weight %. Results are listed in Table 2, from which it is clear that the optimum ratio is 0.1 to 2.5 wt % as in the embodiment 1 of the present invention.

As described hereinbefore, since, according to the present invention, the ceramic insulating layer of the substrate composed of the conductor for wiring layer containing silver as a main constituent and the ceramic insulating layer contains fine silver particle in 0.1 to 2.5 wt %, diffusion of silver contained in the conductor into the ceramic insulating layer during sintering process is restricted and thus the characteristics of the conductor as wiring after sintered can be stabilized.

TABLE 2

| adding rate of fine silver particle (wt %) specific resistance of conductor (wiring) ($\mu\Omega \cdot$ cm) | 0 | 0.1 | 1.0 | 2.5 | 5.0 | 10.0 |
|---|---|---|---|---|---|---|
| Ag: 100 | 2.3~3.9 | 2.3~2.4 | 2.3~2.4 | 2.3~2.4 | 2.3~2.4 | 2.3~2.4 |
| 95 | 5.5~10.8 | 5.5~5.9 | 5.5~5.9 | 5.5~5.9 | 5.5~5.9 | 5.5~5.9 |
| shrinking rate (%) | 15.8 | 16.2 | 16.1 | 16.2 | 16.0 | 15.9 |
| density of material to be sintered (g/cm$^3$) | 2.25 | 2.26 | 2.27 | 2.29 | 2.32 | 2.40 |
| bending strength (kg/cm$^2$) | 1600 | 1600 | 1700 | 1700 | 1500 | 1600 |
| dielectricity | 4.4 | 4.4 | 4.4 | 4.6 | 5.2 | 6.9 |
| dielectric loss | 0.002 | 0.002 | 0.002 | 0.1 | 0.05 | 0.10 |
| insulating resistance ($\Omega \cdot$ cm) | $710^{13}$ | $710^{13}$ | $710^{13}$ | $710^{12}$ | $710^{9}$ | $710^{6}$ |
| breakdown voltage (KV/cm) | 7150 | 7150 | 7150 | 7120 | 7100 | 750 |
| thermal expansion coefficient ($\times 10^{-7}/^\circ$C.) | 33 | 33 | 33 | 39 | 46 | 59 |

What is claimed is:

1. A ceramic substrate comprising:
   a ceramic body having a major face and consisting essentially of alumina and glass;
   silver particles having a 1 to 5 $\mu$m diameter and being dispersed substantially uniformly in said ceramic body; and
   a wiring layer formed on said major face of said ceramic body and being made of silver or a material containing silver;
   wherein;
   in every portion of said ceramic body, the weight percentage of said silver particles is 0.1% or more, to stabilize the specific resistance of said wiring layer, and is 2.5% or less, to preserve the insulating characteristics of said ceramic body.

2. A ceramic substrate comprising a ceramic body, said ceramic body comprising a plurality of ceramic insulating layers stacked up to each other, each of said ceramic insulating layers containing silver particles and having upper and lower faces, and a wiring pattern made of silver or material containing silver formed on said upper and/or lower faces of said ceramic insulating layers such that one group of wiring layers of said wiring pattern is positioned within said ceramic body, said silver particles being substantially, uniformly dispersed in said ceramic insulating layers so that the weight percentage of said silver particles in every portion of said ceramic insulating layers is 0.1% or more for making the specific resistance of said wiring pattern stable, and is 2.5% or less for preventing a degradation of the insulating characteristics of said ceramic insulating layers.

3. A ceramic substrate of claim 2, in which through holes are formed in said ceramic insulating layers, said through holes extending from said upper faces to said lower faces, and wirings layers of said wiring pattern fill said through holes.

4. A ceramic substrate of claim 2, in which said wiring pattern includes first electrode wirings formed on said upper face of the most upper ceramic insulating layer among said stacked ceramic insulating layers for bonding a semiconductor element, and second electrode wirings formed on said lower face of the most lower ceramic insulating layer among said stacked ceramic insulating layers for bonding outer terminals including input and output terminals.

5. A ceramic substrate of claim 2, in which said ceramic body is constituted of a main material and said silver particles, said main material consisting essentially of alumina and glass.

6. A ceramic substrate of claim 5, in which said glass is borosilicate series lead glass.

7. A ceramic substrate of claim 2, in which each of said silver particles has a grain diameter of 1 to 5 $\mu$m.

8. A ceramic substrate of claim 2, in which said ceramic body is constituted of a main material and said silver particles, said main material is selected from the group consisting of quartz glass, cordierite, and borosilicate glass.

* * * * *